United States Patent
Feiweier et al.

(10) Patent No.: US 7,649,353 B2
(45) Date of Patent: Jan. 19, 2010

(54) MAGNETIC RESONANCE IMAGING METHOD AND APPARATUS USING A CIRCULARLY POLARIZED RF RESONATOR DETECTING RIGHT AND LEFT CIRCULARLY POLARIZED COMPONENTS OF MR SIGNALS

(75) Inventors: Thorsten Feiweier, Poxdorf (DE); Razvan Lazar, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 424 days.

(21) Appl. No.: 11/508,813

(22) Filed: Aug. 22, 2006

(65) Prior Publication Data

US 2009/0309594 A1 Dec. 17, 2009

(30) Foreign Application Priority Data

Aug. 22, 2005 (DE) ........................ 10 2005 039 686

(51) Int. Cl.
*G01V 3/00* (2006.01)
*A61B 5/055* (2006.01)
(52) U.S. Cl. ........................ 324/309; 324/307; 324/314; 324/318; 600/410
(58) Field of Classification Search ......... 324/300–322; 600/407–435
See application file for complete search history.

(56) References Cited

U.S. PATENT DOCUMENTS 3,513,381 A * 5/1970 Happer, Jr. .................. 324/304

| | | | | |
|---|---|---|---|---|
| 5,194,811 A * | 3/1993 | Murphy-Boesch et al. | .. | 324/318 |
| 5,202,635 A * | 4/1993 | Srinivasan et al. | .......... | 324/322 |
| 5,212,450 A * | 5/1993 | Murphy-Boesch et al. | .. | 324/318 |
| 5,557,247 A | 9/1996 | Vaughn, Jr. | .................. | 333/219 |
| 5,949,311 A * | 9/1999 | Weiss et al. | .................. | 333/202 |
| 7,221,162 B2 * | 5/2007 | Feiweier et al. | ............. | 324/318 |
| 2004/0150401 A1 | 8/2004 | Eberler et al. | ................ | 324/318 |
| 2004/0193038 A1 | 9/2004 | Reykowski et al. | .......... | 600/410 |
| 2005/0140369 A1 * | 6/2005 | Feiweier et al. | ............. | 324/318 |
| 2008/0129298 A1 * | 6/2008 | Vaughan et al. | ............. | 324/322 |

OTHER PUBLICATIONS

"Comparison of Linear and Circular Polarization for Magnetic Resonance Imaging," Glover et al, J. of Mag. Resonance, vol. 64 (1985) pp. 255-270.

* cited by examiner

*Primary Examiner*—Brij B. Shrivastav
*Assistant Examiner*—Tiffany A Fetzner
(74) *Attorney, Agent, or Firm*—Schiff Hardin LLP

(57) ABSTRACT

In an MR imaging method and apparatus which MR images with improved signal intensity, improved signal-noise ratio, improved contrast and improved image homogeneity can be acquired, the polarization state of the magnetic field of the RF pulses radiated into the measurement subject and of the resonance signals emitted by the measurement subject are distorted by the interaction with electrically-active materials of the measurement subject. In the transmission branch of the RF system the RF pulses emitted by a transmission coil are pre-distorted with regard to their polarization state. The sensitivity of the reception branch is optimized such that it is capable of detecting resonance signals independent of their polarization state.

19 Claims, 3 Drawing Sheets

Trial 1A

Trial 1B

Trial 2A

Trial 2B

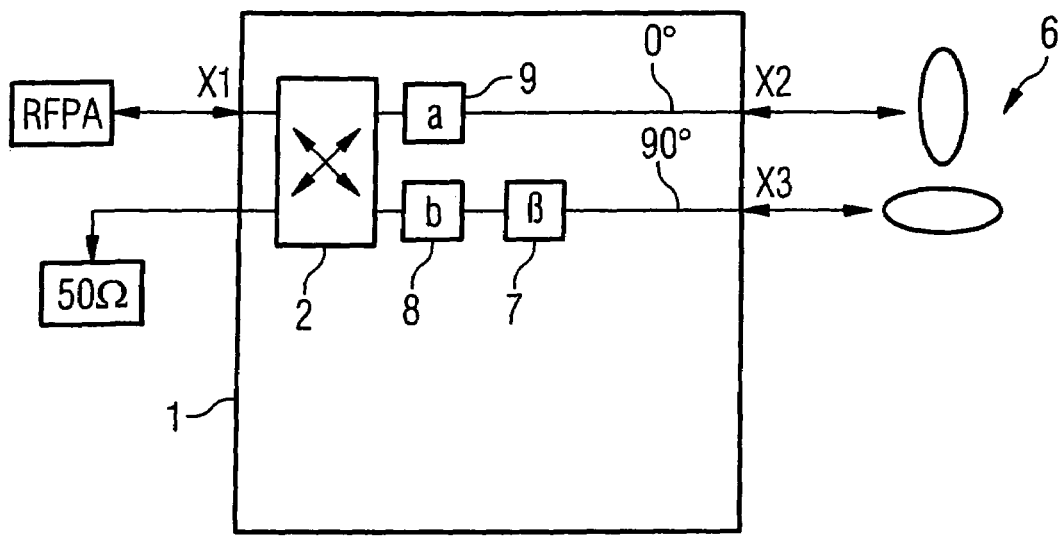
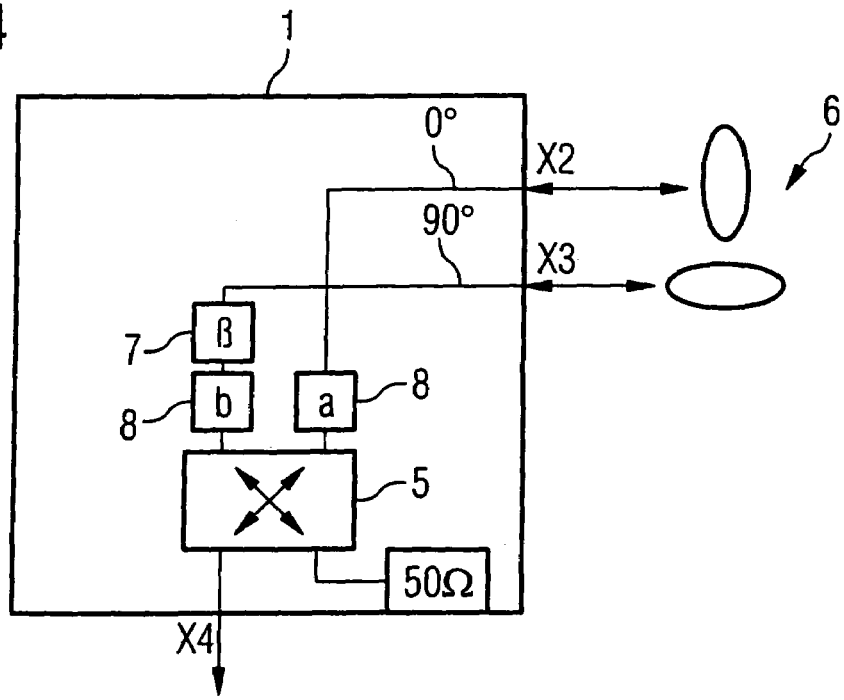

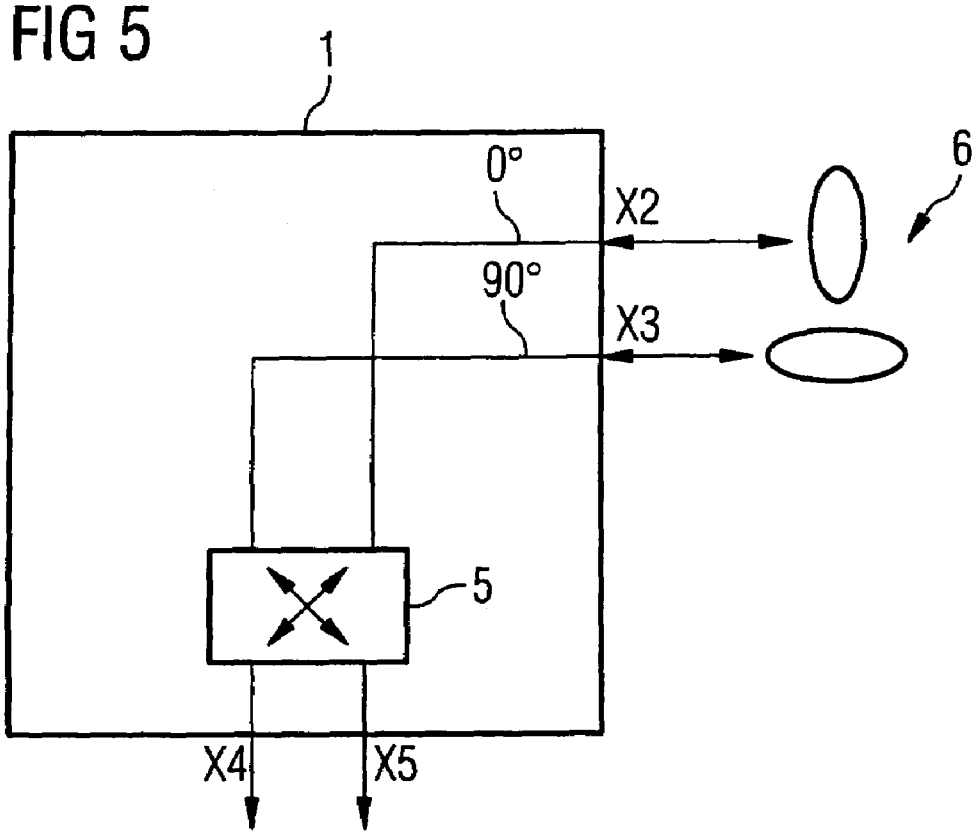

MAGNETIC RESONANCE IMAGING METHOD AND APPARATUS USING A CIRCULARLY POLARIZED RF RESONATOR DETECTING RIGHT AND LEFT CIRCULARLY POLARIZED COMPONENTS OF MR SIGNALS

BACKGROUND OF THE INVENTION

1. Field of the Invention

The present invention concerns a magnetic resonance (MR) imaging method with which additional image information (and thus more homogeneous MR images) can be acquired from an examined measurement subject. It also concerns CP (circularly polarized) coils or coil arrays formed by CP elements as well as a magnetic resonance tomography apparatus includes such CP coils or coil arrays for implementation of an MR imaging method.

2. Description of the Prior Art

MRT (magnetic resonance tomography) is based on the excitation of nuclear spins in body tissues and body fluids of a patient with pulses of radio-frequency energy as well as the detection of the RF signal emitted by the precessing of the nuclear spins. Data about the body tissue and body fluid are collected on the basis of this method, the data subsequently being processed into magnetic resonance images for medical diagnostics.

The quality (and thus significance) of the MR images is influenced by many factors. Examples of such factors are the homogeneity and strength of the basic field $B_0$, the quality of the gradient coils (and therewith the gradient fields switched for slice selection and spatial coding), the filling factor and the performance of the transmission coils and reception coils of the RF system, the generation of auxiliary magnetic fields with shim coils in order to correct inhomogeneities of the basic field, etc. Deficiencies in the system can cause a number of image artifacts. Great efforts are therefore taken to optimize these factors and thus to continuously improve the quality of the generated MR images.

In addition to the above hardware aspects, a further possibility for influencing the quality and the information content of MR images is to vary or optimize the pulse sequence, meaning the chronological sequence of RF pulses, gradient switchings and signal detection. The development of new spin echo sequences such as the HASTE sequence and new gradient echo sequences such as the TrueFISP sequence has enabled the examination of body regions using MR technology that were not previously able to be imaged. This is particularly based on the fact that the $T_1$ and $T_2$ weighting (and therewith the contrast of the acquired MR images) is changed by the newer pulse sequences. $T_1$ is the spin-lattice relaxation constant, $T_2$ is the spin-spin relaxation constant.

In the further development of known methods and the development of newer methods, it is primarily intended to increase the resolution of the images and/or to reduce the measurement time. It is thereby imperative to acquire the MR images with a sufficiently high signal-noise ratio (SNR).

One way to improve the SNR is to increase the strength of the homogeneous basic field $B_0$. Stronger resonance signals are thereby obtained. This approach, however, has disadvantages associated therewith. With higher field strengths, the wavelength of the applied radio-frequency fields reaches the magnitude of the subject dimensions. Under such conditions the penetration behavior of the fields in dielectric and conductive media (for example tissue) leads to a non-homogeneous distribution of the excitation field and to an inhomogeneous distribution of the reception sensitivity. The former directly leads to spatial variations of contrast and brightness in MR images, the latter to an additional variation of the brightness. Moreover, the chemical shift of the signals arising from fat and from water increases, causing artifacts to arise in the MR images. Since, at higher basic field strengths, the tissue counteracts the penetrating RF fields with a greater resistance, the amplitude of the RF excitation pulses must be increased, causing the specific absorption rate SAR to increase. Due to the SAR limits established by national health authorities for protection of the patient, this leads to limitations on the application side.

Even when short measurement times are intended, the SNR can in principle be improved by lengthening the measurement time. Movement artifacts in the MR image, however, increase with longer measurement times; longer measurement times are frequently not tolerated by the patient since his or her residence time in the magnetic resonance tomograph is thereby extended.

To solve this problem, it must be attempted, by optimization of other available parameters, to improve the SNR for a basic field strength $B_0$ and a measurement duration in which the disadvantages described above do not occur, or are insignificant.

One solution involving the radio-frequency system is to use surface coils for the signal detection in the acquisition branch of the RF system. Such coils are directly placed on the region of the measurement subject (such as the human body) to be measured. The signal intensity and the SNR are increased due to the small distance between the measurement subject and the coil. Such surface coils generally are formed by LP (linearly polarized) reception elements, the signals of which are detected and processed independently of one another.

A further solution is the usage of transmission or reception coils in a CP configuration. The basic physical effect on which such a configuration is based is that the precession movement of the magnetization ensues in a defined direction. In the excitation case the local $B_1$ field must follow this precession movement for the maximum MR efficacy, thus be right circularly polarized. Such a right circularly polarized $B_1$ field can be generated with a CP transmission coil. During the signal detection the magnetization further precesses in this defined direction and therefore likewise locally generates a right circularly polarized $B_1$ field. This right circularly polarized $B_1$ field can be detected with maximum SNR when a CP reception coil is used.

A CP transmission coil or a transmission array formed by CP elements has at least two separate transmission systems that are designated as a "0° system" and a "90° system". Each of these transmission systems ideally generates in the examination volume a linearly polarized electromagnetic field that temporally oscillates with the MR frequency. The field vectors of both of these linearly polarized magnetic fields are oriented orthogonally to one another and perpendicularly to the external magnetic field. In the CP transmission configuration the field vector of the sum field (generated by the superimposition of the component fields) of the precession movement follows the magnetization, meaning that a circularly polarized radio-frequency electromagnetic field then predominates at the site of the magnetization. This is technically achieved by a phase shift of the excitation current flowing through the 90° system by $\pi/2$ in comparison to the 0° system. The maximum MR-effective excitation field can be generated in this manner for a predetermined transmission power (and therewith a defined SAR).

A CP reception coil or a reception array formed by CP elements analogously has at least two separate reception systems. During the signal detection, the magnetization precesses and locally generates a right circularly polarized magnetic field. The MR signals detected by the two sub-systems are therefore ideally shifted in phase by $\pi/2$ relative to one another. These signals are constructively added by phase shifting of one of the two signals by $\pi/2$ for maximization of the signal/noise ratio SNR.

It should be noted that in the transmission mode and in the reception mode the phase shift of both sub-systems of the antenna structure ensues with different algebraic sign. For a pure transmission antenna or a pure reception antenna, a phase shifter is sufficient for realization of the performance advantage and the SNR advantage. If an antenna is used in both transmission and reception modes, a 90° hybrid component is typically used that in each mode provides the optimal combination of the signals.

Consistent with the statements above, in the prior art circularly polarized (CP) is equated with right circularly polarized, abbreviated in the following with "RCP". In contrast, left circularly polarized, abbreviated in the following with "LCP" magnetic fields, are not used in MR imaging in the prior art.

SUMMARY OF THE INVENTION

A need exists for MR imaging methods and technologies that generate MR images with improved signal intensity and thus improved SNR, improved image contrast and improved image homogeneity under given boundary conditions such as, for example, the strength of the homogeneous basic field $\vec{B}_0$, and the specific absorption rate. An object of the present invention is to provide such improved MR imaging methods and systems and components.

The invention is based on the insight that, under specific circumstances, not only a CP transmission coil according to the prior art in an RCP configuration, but also a CP transmission coil operated in an LCP configuration, can cause MR excitation in a measurement subject and thus is usable for MR imaging. The invention is furthermore based on the insight that the magnetic resonance signals emitted by excited measurement subjects can be detected not only by a CP reception coil operated in a RCP configuration, but also by a CP reception coil operated in LCP configuration. These effects are most pronounced for electrically-conductive materials or materials with high permittivity (which are designed in the following as electrically-active materials), while they turn out to be lower or are absent entirely for media with low electrical conductivity and permittivity. These effects and conclusions form the basis of the present invention.

The above object is achieved in accordance with the present invention by a method for MR imaging that includes the steps of introduction of a measurement subject into a magnetic resonance tomography apparatus in which a homogeneous magnetic field $\vec{B}_0$ is present, adjustment of the parameters of a measurement sequence to be implemented that, for example, is selected from spin echo sequences, gradient echo sequences and mixed forms of such sequences, implementation of the measurement using the measurement sequence, wherein, in the transmission mode, the measurement includes the excitation of the nuclear spins in the measurement subject with RF excitation pulses that are generated by a transmission coil, and in the reception mode the measurement includes the detection with a reception coil of the RF magnetic resonance signals emitted by the measurement subject, the coil system having a combined transmission/reception coil or a transmission coil in combination with a separate reception coil, and processing of the signals detected by the reception coil into an MR image. In accordance with the invention, in the transmission mode, a CP transmission coil or a transmission array formed by CP elements is used that has at least two separate transmission systems, with which each transmission system generating a temporally-oscillating linearly polarized electromagnetic field, and the phase relation of the linearly polarized electromagnetic fields emitted by the transmission systems relative to one another is adjusted such that the sum field generated in the volume of interest by superimposition of these sub-fields exhibits a right circularly polarized electromagnetic field component with maximum amplitude locally at the site of the nuclear spins to be excited. Also in accordance with the invention, in addition to the above or as an alternative thereto, in reception mode, a CP reception coil or a reception array formed by the CP elements is used that has at least two separate reception systems, and the reception sensitivity of the reception systems is adjusted for the resonance signals emitted by the magnetic dipoles such that a maximum portion of the right circularly polarized signal portions emitted by the measurement subject and a maximum portion of the left circularly polarized signal portions emitted by the measurement subject are detected.

If only the first alternative is used, the RF excitation pulses emitted by the CP transmission coil are neither linearly polarized nor right circularly polarized before penetration into the measurement subject.

The invention is based on the optimization of the excitation with RF pulses in the transmission mode, or the optimization of the detection of the emitted resonance signals in the reception mode, or the simultaneous optimization of the excitation with RF pulses and the detection of the resonance signals in the transmission mode and reception mode. In the hardware branch in which the inventive optimization is implemented (i.e. in the transmission branch and/or in the reception coil) a CP coil or an array formed by CP elements must be used. In a branch in which no inventive optimization is implemented, the coil or the array can be linearly or circularly polarized.

MR tests with phantoms have been implemented in order to demonstrate the effects that form the basis of the present invention in a simple, straightforward system. These tests are described below in example 1.

It has been established that the polarization state of the $B_1$ field is altered by electrically-active materials. RF eddy currents are induced in these materials that can lead to a shielding effect or, in the case of displacement currents, also to dielectric focusing. These effects overlap and lead to a depolarization or distortion of the polarization of the excitation field. The local polarization state of the $B_1$ field differs more or less strongly from the well-defined polarization state of the $B_1$ field without the present of the measurement subject (such as the body of a patient). The condition for an optimal resonance, namely a perfect right circularly polarized local $B_1$ field at the site of the magnetic dipole, is thus not satisfied in practice even when a perfect right circularly polarized $B_1$ field is generated by the CP transmission coil. The signal intensity and the SNR thereby decrease. Conversely, the distortion of a left circularly polarized $B_1$ field due to the presence of the measurement subject leads to the situation that a more or less strongly reconstituted RC polarized $B_1$ field dependent on the magnitude of the distortion locally exists at the site of the magnetic dipole, such that nuclear magnetic resonance occurs.

The situation is the same for the detection of the MR signals generated by the precessing magnetization; in this case the magnetization can be considered as a local RF transmission antenna. The local $B_1$ field generated by the precession movement is always right circularly polarized. A distortion of the MR signals occurs due to the presence of the measurement subject with electrically-active materials, such that an antenna in CP reception configuration with exclusively RCP sensitivity according to the prior art still detects only a portion of the signals. In contrast to this, an inventively-designed CP reception system exhibits sensitivity both for the RCP signal components and the LCP signal components and thus detects the entire signal intensity. For simplification of the terminology, in the following it is stated that the "polarization state of the MR signal" is distorted due to the presence of the subject in the reception mode.

The human body represents a complex conglomeration of materials with different electrical conductivity. The materials in the sense of the above definition can be predominantly considered as electrically-active materials. When the entire examination volume is considered, the locally-prevailing transmission field is in principle distorted with differing severity at various points of the examination volume due to the complex geometry of the body and the spatial distribution of the electrical properties of the different tissue types. Since the number of available adjustment parameters for optimization of the local $B_1$ field is limited, it is not possible to generate a pure RCP field at every location of the examination volume.

In the transmission mode, the goal of the inventive optimization of the local $B_1$ field is to adjust the polarization state of the radiated RF transmission field such that an RCP field with optimally high amplitude and an LCP field with optimally low amplitude locally prevail in the examination volume of interest (VOI) at the site of the magnetic dipole to be excited, since the latter LCP field supplies no MR relevant information and only effects an increase of the SAR.

The same applies in the reception mode for the inventive optimization of the signal detection. Since the polarization state of the resonance signals in the sense described above is altered due to the presence of the body and the interaction with electrically-active substances, in this case the optimization allows an optimally high proportion of the MR signal to be detected independently of the polarization state by suitable adjustment of the sensitivity of the reception system.

A number of advantages are provided by the inventive MR imaging methods:

A) Transmission Mode

By the optimization of the polarization state of the radiated RF excitation pulses nuclear spins are excited significantly more strongly in regions that are only weakly excited without optimization, such that the intensity of the emitted resonance signals increases for these regions. The additional image information is complementary to image information that is acquired without this optimization. New possibilities for diagnostics arise from this;

These regions, whose mapping is only possible with high transmission amplitudes and corresponding high SAR according to the prior art, can be measured with distinctly smaller RF powers, such that the SAR turns out to be lower;

Due to the optimization of the polarization state of the radiated RF pulses the measurements for a given RF power can be implemented faster or with higher resolution without reduction of the SNR;

B) Reception Mode

By the optimization of the polarization sensitivity in the reception branch, i.e. the sensitivity for a specific polarization state of the MR signals, an effect results similar to as in the transmission branch. A reception branch optimized with regard to the polarization states of the MR signals detects a higher signal intensity via simultaneously-optimized detection of RCP-RF and LCP-RF signal portions;

As in the transmission branch, additional complementary image information is acquired by the optimization;

Such an optimized reception branch likewise contributes to an optimal SNR, a homogeneous contrast and a homogeneous brightness. This aspect is particularly important when an MR image acquired with a volume coil as a reference image should be used for the normalization of images acquired with a surface coil.

According to a first preferred embodiment of the inventive method, the optimization of the polarization state of the radiated RF pulses is implemented such that a high RCP portion that is simultaneously optimally constant across the VOI is obtained within the VOI. The advantage of this embodiment is that more homogeneously exposed MR images with uniformly high contrast and uniformly high SNR are acquired.

According to a further preferred embodiment of the inventive method, the optimization of the polarization state of the radiated RF pulses is implemented such that an RCP field with maximum amplitude is obtained specific region of the VOI such as a body organ (such as of the abdomen). Individual organs that are shown only with poor signal without optimization can be mapped in this manner with particularly high contrast and high SNR.

According to a further preferred embodiment, the inventive method includes the following steps:
a) establishment of N regions of interest of the VOI, whereby the N is a whole number (for example 2, 3, 4, 5 . . . ),
b) optimization of the polarization state of the radiated RF pulses for a first region and acquisition of a first MR image,
c) repetition of step b) for the remaining (N−1) regions,
d) combination of these MR images into a single MR image to obtain an MR image whose information content corresponds to the set union of the individual images.

According to a preferred embodiment of the inventive method, the polarization state of the RF excitation pulses in the transmission mode is set to a fixed, optimized value with an adjustable phase shifter for adjustment of the phase shift $\beta$ between the sub-fields of the various transmission systems and with two fixed adjustable attenuators for adjustment of the attenuation a or b of the amplitudes of the sub-fields of the various transmission systems.

The adjustment of a fixed, optimized value means that the circularity of the CP coil or of the array of CP elements of the transmission branch can no longer be changed by the operator of the magnetic resonance tomography (MRT) apparatus. Such a fixed setting is always reasonable when all measurement subjects examined with this coil show a similar electrical behavior: a nearly optimal local RCP field is then always generated with a fixed pre-distortion of the transmission field. An example for this is the fixed setting of an optimized transmission field in the case of head coils. The advantage of this embodiment is that CP transmission coils present in MRT apparatuses can be converted with little effort in order to be able to use in the inventive method.

In the case of a transmission system composed of a 0° transmission system and a 90° transmission system, the adjustment elements for the optimization of the transmission field are the phase shift $\beta$ between the two linearly polarized fields of the two transmission systems and the attenuation of the amplitude of the two linearly polarized fields by the factor a for the 0° system and the factor b for the 90° system. Since an optimized MR excitation is generally achieved neither by a pure RCP configuration nor by a pure LCP configuration, the value of β is typically different from the β value of π/2 used in the prior art. The attenuation values a and b to be set can be different than 1, and a can be different than b.

In the simplest embodiment, the phase shifter is an RF conductor with a defined electrical length while the attenuators are defined electrical resistors. An arbitrary mixed state formed by the RCP polarization and the LCP polarization can be generated with these three adjustment elements.

The practical realization of a mixed state between RCP and LCP transmission configurations that ultimately corresponds to an elliptically polarized transmission configuration is described in detail in example 4 with reference to FIG. 3.

According to a further preferred embodiment of the inventive method, the polarization state of the RF pulses emitted by the CP coil or the array of CP elements in the transmission mode is variably set, dependent on the examined measurement subject, with the aid of the adjustment elements a, b and β using a fixed-power phase shifter, one or more attenuators and a control software. This method is described in detail in example 5.

With the possibility of a variable adjustment of the circularity, optimized results can also be achieved given measurement subjects with different electrical behavior. An inventive method for subject-dependent optimized adjustment of the circularity of the transmission coil is likewise described in example 4. The goal of the optimization is to optimize the local $B_1$ field predominating in the examination region of interest of the measurement subject such that the amplitude of the (average) local RCP field is maximal and the amplitude of the (average) local LCP field is minimal in order to maximize the signal intensity given simultaneously-minimized heating of the measurement subject.

The optimization of the polarization state of the RF pulses effected in the transmission mode can be understood as a pre-distortion that is largely cancelled by the local depolarization processes in the measurement subject such that locally a maximum averaged RCP $B_1$ field prevails.

According to a further embodiment, the fixed or the variable setting of an optimized polarization state of the RF pulses is implemented in that the attenuation values a and b and the phase shift β are iteratively varied in the transmission branch of the RF system under successive acquisition of a number of MR images until the acquired MR image is homogeneously exposed. This method is described in detail in example 4.

According to another embodiment, the optimization of the polarization state of the RF pulses ensues using a mathematical optimization method with which the adjustment elements a, b and β are optimized (see examples 4 and 5).

According to a further preferred embodiment of the inventive method the polarization sensitivity of the CP coil or of the array of CP elements is set to a fixed optimized value in the reception operation. This fixed setting of the optimization polarization sensitivity can be implemented with the aid of a phase shifter and two attenuators in the reception branch. Example 6 is referred to for a detailed description of this method.

Fixed setting means that the circularity of the coil(s) of the reception branch can no longer be changed by the operator of the magnetic resonance tomograph. Such a fixed setting is always reasonable when all measurement subjects examined with this coil show a similar electrical behavior: a maximum sensitivity for the local RCP polarization (originally present in the VOI) of the MR signals generated by the precessing magnetization is achieved with a fixed setting of the reception sensitivity for the various polarization states of the emitted MR signals. A fixed adjustment of the reception sensitivity to an optimized value can, for example, be considered in the case of head coils. An advantage of this method is that CP reception coils and arrays of CP reception elements can be converted for the implementation of this method with very small effort.

A further embodiment includes the following steps:
providing of a CP coil or an array of CP elements that are connected in the reception branch of the RF system with a reception hybrid that has two parallel reception channels, with the first reception channel acquiring the entire right circularly polarized signal portion and the second reception channel acquires the entire left circularly polarized signal portion and providing these signal portions at respective outputs, storing of the right circularly polarized signals in a first raw data matrix and the left circularly polarized signals in a second raw data matrix, processing the data of the first raw data matrix into an RCP MR image and the data of the second raw data matrix into an LCP MR image in a system computer.

The MR images obtained according to the above method, i.e. the LCP MR image and the RCP MR image, can be inventively combined into an overall image using a mathematical algorithm. This algorithm can be a quadratic summation.

In this variant, which is explained in detail in example 7, it is particularly advantageous that many CP reception coils or arrays of CP elements used in the prior art can be converted with only small effort in order to be able to use them in this method. A further advantage of this method is that the reception branch of RF systems of the prior art typically is a reception hybrid with two reception channels, of which only the channel that detects the RCP signals is used. There are therefore no additional requirements for the hardware with regard to the reception hybrid. Due to the usage of both reception channels, the LCP signal portion can additionally be detected without extending the measurement time. In practice, homogeneously-exposed images with higher SNR are obtained without additional expense via the subsequent combination of the LCP MR image with the RCP MR image.

In summary, the various embodiments of the inventive method are based on at least one of the following steps:
optimization of the polarization state of the radiated RF pulses with retention of hard-set optimized values, optimization of the polarization state of the radiated RF pulses, whereby the optimization is variably implemented dependent on the measurement subject examined, optimization of the reception sensitivity for RCP signals and LCP signals with retention of hard-set optimized values, detection of the complete RCP signal portion and of the complete LCP signal portion in separate reception channels of a reception hybrid.

Each of these steps is a basis of a version of the inventive method, meaning that one of the previously-described optimizations is implemented in either the transmission branch or the reception branch. The present invention, however, encompasses all methods that result from the combination of an inventive optimization in the transmission branch and an inventive optimization in the reception branch, with such combinations and double optimizations yielding the best possible MR images. From this point of view, the inventive embodiment is particularly preferred in which the polarization state of the radiated RF excitation pulses is variably optimized dependent on the measurement subject and in which the complete LCP signal portion and the complete RCP signal portion are simultaneously detected using parallel channels in the reception hybrid to acquire an LCP MR image and an RCP MR image, after which both MR images are combined into an overall image using a suitable algorithm.

According to a further preferred embodiment, the MR images that have been acquired with a CP volume coil as a transmission and reception coil using one of the inventive methods described further above are used as reference images for the normalization of MR images that have been acquired with arbitrary surface or local coils.

This inventive method for generation of normalized MR images with a local coil includes the following steps of acquisition of an MR image of a volume of interest under implementation of one of the inventive methods described above, using a CP volume coil as a transmission coil and as a reception coil, to acquire a homogeneously-exposed MR image that is used as a reference image whose voxels exhibit the brightness values $M_R(r)$, acquisition of a further MR image of the same volume of interest, using the aforementioned, same CP volume coil as a transmission coil that emits RF pulses with a polarization state optimized in the same manner as in the preceding stop, and using a local coil as a reception coil to acquire an MR image whose voxels exhibit the brightness values $M_L(r)$, determination of the sensitivity profile $S(r)$ of the local coil, by calculating the quotient of $M_L(r)$ and $M_R(r)$ per voxel, acquisition of further MR images, using the aforementioned, same local coil as a reception coil, normalization of the MR images acquired by multiplying these MR images per voxel with $1/S(r)$.

According to a preferred embodiment of the normalization method, a CP local coil is used in the last two acquisition steps above as a reception coil and the identical optimization of the reception sensitivity of this CP local coil is implemented in these steps according to one of the methods described further above that relates to the optimization of the reception sensitivity.

A series of 2D images or a 3D image is advantageously acquired to cover the entire examination volume.

A detailed description of the inventive normalization method is contained in example 8.

The variants of the inventive method that optimize the reception branch provide distinctly more homogeneous images without greater changes to already-existing techniques, which represent a significant requirement for a good quality of the image normalization.

Since the variation of the polarization state of RF radiation in an electrically-active measurement subject turns out to be stronger the stronger the basic field magnet $B_0$, the inventive methods are advantageously used with a high strength of the basic field magnet $B_0$ of 1.0 Tesla or above, even more preferably with an external magnetic field of 2.0 Tesla or above. The method is most advantageously implemented with a strength of the basic field magnet $B_0$ of 3.0 Tesla or above.

The above object also is achieved in accordance with the present invention by a magnetic resonance tomography apparatus for implementation of the inventive method. This magnetic resonance tomography apparatus has an RF system in which: the transmission branch is equipped with a fixed phase shifter and two attenuators or a power-resistant adjustable phase shifter and two attenuators; and/or the reception branch is equipped with a power-resistant adjustable phase shifter and two attenuators and/or two reception channels for simultaneous acquisition of the RCP signal portions and the LCP signal portions. In the case of the variable optimization of the polarization state of the RF signals in the transmission branch, the magnetic resonance tomograph is equipped with control software.

The above object also is achieved in accordance with the invention by a CP local coil or a coil array formed by CP elements; the CP local coil or each CP element of the coil array having a resonator structure and an integrated activation unit; and the activation unit having a transmission branch with a transmission hybrid and/or a reception branch that has a reception hybrid and possibly a transmission/reception duplexer. In this CP local coil or coil array the transmission branch has two transmission systems that, for optimization of the polarization state of the RF excitation pulses in the transmission operation, have an adjustable phase shifter for setting of the phase shift β between the sub-fields of both transmission systems and one or two adjustable attenuators for setting of the attenuation a, b of the sub-fields of both transmission systems to a fixed set or variably adjustable optimized value. Alternatively or in addition, the reception branch has two reception systems that, for optimization of the reception sensitivity of the CP local coil in the reception mode, has an adjustable phase shifter for setting of the phase shift β between the sub-fields of both reception systems and one or two adjustable attenuators for setting of the attenuation a, b of the sub-fields of both transmission systems to a fixed set or variably adjustable optimized value. Alternatively or in addition, the reception branch has two parallel reception channels, the first reception channel acquiring and providing the entire right circularly polarized signal portion and the second reception channel acquires and provides the left circularly polarized signal portion.

The aforementioned CP local coil or the coil array formed by CP elements can be a pure CP transmission coil, a pure CP reception coil or a combined CP transmission/reception coil.

DESCRIPTION OF THE DRAWINGS

FIG. 3 is a block diagram of the activation unit of a CP coil reduced to the components necessary for the transmission mode in accordance with the invention.

FIG. 4 is a block diagram of the activation unit of a CP coil reduced to the components necessary for the reception mode in accordance with the invention.

FIG. 5 shows an activation unit with which both the LCP signal portion and the RCP signal portion are detected in the reception mode in accordance with the invention.

DESCRIPTION OF THE PREFERRED EMBODIMENTS

The results of preliminary tests and the physical fundamentals of the inventive methods are shown in the examples 1 through 3. Embodiments of the inventive method are described in the examples 4 through 8.

Example 1

The effects that form the basis of the present invention have been examined and verified with the aid of spherical phantoms. A first phantom comprises an aqueous nickel sulfate solution as a substance with high electrical permittivity. A second phantom comprises mineral oil as a substance with low electrical permittivity. In contrast to examinations on the human body, in which materials with different electrical properties (such as blood vessels, muscle and fatty tissue)

occur next to one another in the most cramped space and in complex spatial arrangement, phantoms enable an examination in a simple model. Phantom examinations thus allow reliable conclusions about phenomena to be examined.

Figure 2:
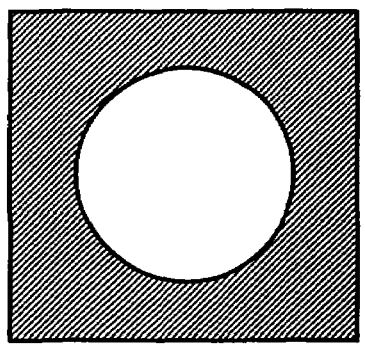
FIG. 2 illustrates the results of preliminary tests that have been obtained with phantoms that are filled with mineral oil or a nickel sulfate solution.
Figure 2:
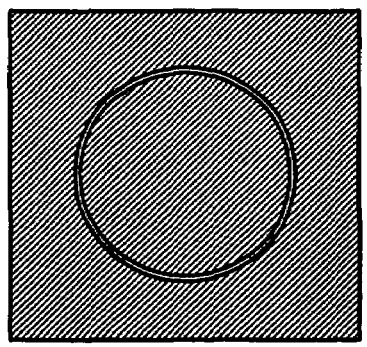
Figure 2:
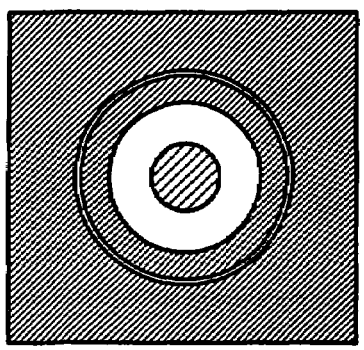
Figure 2:
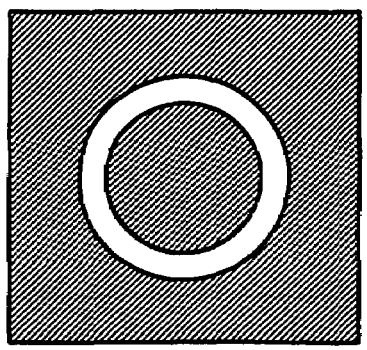

The results of the examinations are schematically shown in FIG. 2.

Figure 1:
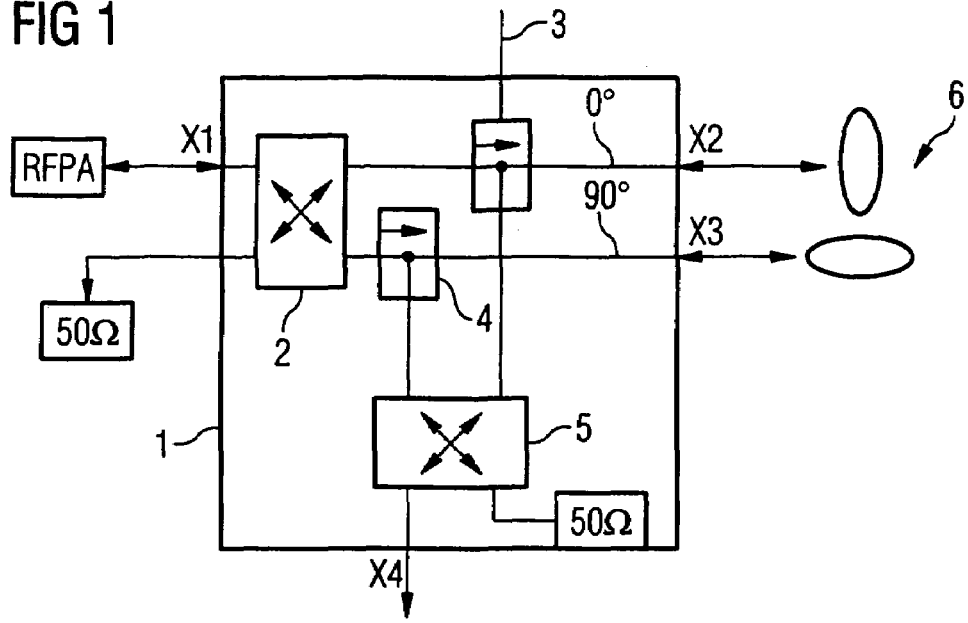
FIG. 1 is a block diagram from the RF system of an MR apparatus according to the invention.

The examinations have been implemented in a typical magnetic resonance tomograph. A section from this radio-frequency system is schematically shown in FIG. 1. The section shows a body coil channel selector 1 that has a transmission hybrid 2 (Tx hybrid), a reception hybrid 5 (RX hybrid) and two transmission-reception duplexers 3, 4. The RF voltages generated by the RF power amplifier (RFPA) arrive in the channel selector 1 via the input X1. In the transmission hybrid 2 the voltages are distributed to the two transmission systems (0° and 90°) of the body coil 6 such that a $B_1$ field with the desired circularity arises in the body coil. Before the signals are sent to the body coil 6 via the outputs X2 and X3 of the channel selector 1 they pass through both transmission-reception duplexers 3, 4, which serves to decouple the transmission branch and the reception branch of the body coil. The high RF amplitudes in the transmission mode are thus prevented from reaching the reception path and prevent noise from the transmission path is prevented from reaching the reception path in the reception mode. The body coil 6 generates the circularly polarized RF fields for examination of the phantoms.

The MR signals emitted by the phantoms are detected by the body coil 6. The signal acquired by both reception systems of the body coil arrives in the channel selector 1 via the inputs X2 and X3. After passing through the transmission-reception duplexers 3, 4, the acquired signal passes through low-noise amplifiers. The reception hybrid 5 combines the signals of both reception systems of the body coil (0° and 90°) by means of phase shifting such that RC polarized signals are present at the output X4, which RC polarized signals are subsequently sent to the Rx cassettes (which are reception modules with AD converters).

For the laboratory examination described here, the polarization direction in the transmission branch is changed by exchanging the cables at the outputs X2 and X3 that are connected with the transmission coil. A change of the polarization direction effected there also changes the polarization sensitivity in the reception branch. A change of the polarization state exclusively of the transmission branch from RCP to LCP can be achieved by exchange of the cables at the output of the transmission hybrid 2. FIG. 1 shows the design of the channel selector in the region of the reception hybrid 5 as it is typically used in the prior art. The LCP output signal normally remains unutilized and is dissipated in a 50Ω resistor. According to the invention, this unutilized LCP output signal of the reception hybrid 5 is directed from the channel selector via an output X5 and is immediately available for the MR image generation.

Four tests A1 through B2 are implemented according to Table 1:

TABLE I

|    | Phantom substance | Polarization in transmission branch | Sensitivity of the reception branch |
|----|-------------------|-------------------------------------|-------------------------------------|
| A1 | Mineral oil       | RCP                                 | RCP                                 |
| A2 | Mineral oil       | LCP                                 | LCP                                 |
| B1 | NiSO$_4$ solution | ROP                                 | ROP                                 |
| B2 | NiSO$_4$ solution | LOP                                 | LOP                                 |

The examination of the phantoms ensues with the aid of a spin echo sequence given an echo time TE of 15 ms and a bandwidth of 130 Hz/pixel. A body coil serves both for the generation of the RF excitation pulses and for the detection of the RF resonance signals emitted by the measurement subject.

In test A1, a homogeneous exposure with uniform SNR is obtained for the mineral oil phantom. The RCP RF fields with which protons can be excited according to the theory are spatially homogeneously distributed. The magnetization precesses in a manner that is locally RC polarized, and the MR signals are acquired in the reception branch (via the channel that is sensitive for RC polarized MR signals) and yield the uniformly exposed MR image of the phantom after further processing.

In test A2 the polarization direction or, respectively, sensitivity in the transmission branch and in the reception branch are changed, meaning that the transmission coil generates LCP RF fields and in the reception branch only the signals are detected that are LC polarized. Here the expected result is also obtained. An excitation of the protons of the mineral oil with LCP RF fields is not possible because the polarization of the RF radiation does not coincide with the precession movement of the protons. The MR image shows the typical noise but contains no image information.

The phantom filled with the nickel sulfate solution behaves entirely different in the test B1: given excitation with RCP RF fields and detection with a reception coil that is sensitive to RC polarized MR signals, the MR image of the phantom exhibits a completely shadowed annular border [boundary] region. For this border region it can be concluded that the RCP RF excitation fields within the phantom are so strongly distorted by RF eddy current induction and displacement currents that the local $B_1$ field is no longer RC polarized but rather is LC polarized at the site of the protons to be excited, such that a nuclear excitation does not occur. A particularly light ring follows inwards. Here the polarization of the RF excitation radiation obviously optimally coincides with the RC polarization of the local excitation field for the nuclear excitation in spite of the distortions of the polarization occurring within the phantom. An internal circular area that is concentric with the contour of the phantom then again shows a lower signal intensity: the local RCP $B_1$ fields here are so strong that an "overwinding" of the local magnetization occurs, meaning that the magnetization vector is rotated antiparallel to the external magnetic field across the transversal plane. The transversal magnetization amplitude relevant for the MR decreases again around the center of the phantom. In principle, changes of the $B_1$ field amplitude can also occur in addition to changes of the polarization state; generally both effects occur in the framework of the inhomogeneous penetration behavior of RF fields.

In the test B2, the phantom filled with the nickel sulfate solution is excited with the transmission coil in LCP configuration. The reception range is sensitive to LC polarized resonance signals. In this case the MR image of the phantom exhibits a practically complete shadowing in the region of a large central circular area, meaning that the signal intensity here is zero, while the annular border region that was without signal in test B1 now delivers a high signal intensity.

The high permittivity of water promotes the development of dielectric focusing; this causes displacement currents that are comparable to shielded exposures but have a different magnitude, phase and distribution. This phenomenon qualitatively leads to a change of the amplitude, the phase and therewith of the polarization state of the $B_1$ field; expressed differently, the $B_1$ RF field is distorted by electrically-active substances. The polarization state of the $B_1$ RF field in the measurement subject therefore no longer coincides with the polarization state of the $B_1$ RF field without the presence of the measurement subject. Given a spherical phantom, these effects have spherical symmetry in first approximation, such that the described annular structure results in the MR image of the phantom.

These effects are schematically shown in FIG. 2 for the tests 1A through 2B for a direct comparison. The mineral oil phantom, which leads to no distortion of the polarization state of the $B_1$ field, is uniformly bright given RCP RF excitation/reception and invisible given LCP RF excitation/detection. The phantom with the nickel sulfate solution exhibits a concentric intensity path. Given RCP RF excitation/detection, the MR image remains dark where a signal is acquired with LCP RF excitation detection and vice versa: in the case of electrically-active substances the MR image acquired with LCP RF excitation and detection supplies image information that is complementary to the image information that is acquired given RCP RF excitation and detection.

Example 2

The tests described in example 1 were repeated with a torso phantom that comprises a shell-shaped region filed with a sodium chloride solution and a core filled with mineral oil. This phantom is typically used for the adjustment of local coils; it produces an electrical load of the coil system that is comparable to the body and moreover exhibits more structure than the spheres. The results completely coincide with the results from example 1. The boundary between the various phantom fluids is shown with sharp edges.

Example 3

The tests from example 2 on the torso phantom that is filled with a sodium chloride solution were repeated with a different coil combination. A body coil was again used as a transmission coil. A linearly polarized surface coil with a plurality of elements served as a reception coil. Aside from the expected interference of the coil profiles on the image, here a behavior similar to as in the examples 1 and 2 (with the body coil as a reception coil) was attained. The images that were generated with a linearly polarized reception coil show that, phenomena that occur in the transmission phase (thus in the excitation phase) have an effect on the generation of the LCP RF images. The coil profiles (which are superimposed) do not contribute to the observed phenomena.

Example 4

The information obtained in the framework of the fundamental experiments of the examples 1 through 3 and theoretical considerations are used for an optimized MR excitation. In general, the CP transmission coil is thereby operated neither in pure RCP configuration nor in pure LCP configuration in order to locally generate an (the average) maximum RC polarized $B_1$ field. The practical realization of a mixed state between RCP and LCP transmission configuration that ultimately corresponds to an elliptically polarized transmission configuration is described in the following.

FIG. 3 shows a representation of the activation unit reduced to the components necessary for the transmission mode. In addition to the components in FIG. 1, here a fixed adjustable phase shifter 7 (shifting by β) and two adjustable attenuation elements 8, 9 (respectively adjustable to set attenuation factors $\underline{a}$ and b, meaning $I(0°)'=\underline{a}\cdot I(0)°$ and $I(90°)'=b\cdot I(90°)$) are present. As components in the transmission branch these must be implemented power-resistant. In the simplest realization form, the phase shifter is an RF conductor with a defined electrical length and the attenuators are defined electrical resistors. An arbitrary mixed state formed by RCP and LCP polarizations can be generated with these three adjustment elements, as the following derivation shows:

RCP transmission configuration: a=b=1, β=0. With the RF current $I(t)=I_0 (\omega t+\phi)$ it follows:

$I_0 \cos(\omega t+\phi)+iI_0 \sin(\omega t+\phi)=I_0\exp(i(\omega t+\phi))$

LCP transmission configuration: a b=1, β=180°

$I_0 \cos(\omega t+\phi)-iI_0 \sin(\omega t+\phi)=$ $I_0 \cos(-\omega \cdot t-\phi)+iI_0 \sin(-\omega \cdot t-\phi)=I_0\exp(-i(\omega t+(\phi)))$ For a mix (a, b, β arbitrary):

$$aI_0\cos(\omega \cdot t + \varphi) + ibI_0\sin(\omega \cdot t + \varphi + \beta) =$$

$$aI_0\cos(\omega \cdot t + \varphi_a) + ibI_0\sin(\omega \cdot t + \varphi_b) =$$

$$\frac{aI_0}{2}(\exp(i(\omega t + \varphi_a))(-i(\omega t + \varphi_a))) +$$

$$\frac{bI_0}{2}(\exp(i(\omega t + \varphi_b)) + \exp(-i(\omega t - \varphi_b))) =$$

$$\left(\frac{a}{2}\exp(i\varphi_a) + \frac{b}{2}\exp(i\varphi_b)\right)I_0 e^{i\omega t} + \left(\frac{a}{2}\exp(-i\varphi_a) - \frac{b}{2}\exp(-i\varphi_b)\right)$$

$$I_0 e^{i\omega t} = C_{RCP}e^{i\gamma RCP}I_0 e^{i\omega t} + C_{LCP}e^{i\gamma LCP}I_0 e^{-i\omega t}$$

Field components generated by the 0° system have been defined along the real axis of the complex coordinate plane and field components generated by the 90° system have hereby been defined along the imaginary axis. $C_{rcp}$ and $\gamma_{rcp}$ designate amplitude and phase of the RCP portion of the transmission field, $C_{rcp}$ and $\gamma_{rcp}$ the LCP portion. The adjustment variables a, b and $\beta=\phi_b-\phi_a$ can be unambiguously calculated with this correlation from the optimization variables $C_{rcp}, C_{lcp}, \gamma_{rcp}, \gamma_{lcp}$. By comparison of the real part and imaginary part of the complex numbers, the following equations result:

$$a^2 = C_{rcp}^2 + C_{lcp}^2 + 2C_{rcp}C_{lcp}\cos(Y_{rcp} + Y_{lcp})$$

$$b^2 = C_{rcp}^2 + C_{lcp}^2 - 2C_{rcp}C_{lcp}\cos(Y_{rcp} + Y_{lcp})$$

$$\tan\varphi_a = (C_{rcp}\cos Y_{rcp} + C_{lcp}\cos Y_{lcp})/(C_{rcp}\sin Y_{rcp} - C_{lcp}\sin Y_{lcp})$$

$$\tan\varphi_b = (C_{rcp}\cos Y_{rcp} - C_{lcp}\cos Y_{lcp})/(C_{rcp}\sin Y_{rcp} + C_{lcp}\sin Y_{lcp})$$

If it is assumed that all subjects examined with the transmission coil behave in a similar manner with regard to the RF penetration behavior, fixed values can be determined for the optimization variables (and as a result for the adjustment variables) that enable a more effective excitation in each subject than CP coils described in the prior art. For example, a similar geometric distribution of the electrical properties is always found in the head given various patients, such that this method promises success with head coils.

The determination of the optimization parameters can ensue, for example, iteratively, meaning that, for a subject with model character that is placed in the coil (for example based on an average head with regard to the electrical properties), various values for the optimization parameters are successively set and the effectiveness and/or the homogeneity of the excitation is measured. As soon as a parameter set with highest effectiveness is found, the associated adjustment parameters are calculated and technically realized in the form of a hard-set phase shifter and two hard-set attenuators. Ideally measurement is always made with the same acquisition configuration during the iteration process.

The methods described in the following can be used for the measurement of the effectiveness. After setting the adjustment parameters, the spatial distribution of the local RCP field $B^+(r)$ is measured by means of an MR experiment. Corresponding MR experiments are known in the literature (for example DE 10354941 A1) and are incorporated herein by reference. The power required to generate the field is additionally determined. The measurement device necessary for such a power measurement is generally part of an MR scanner, but an arbitrary external measurement device can also be used. It is important that both the transmitted power $P_{fwd}$ and the reflected power $P_{rfl}$ can be determined, such that the power necessary for the field generation results as $P=P_{fwd}-P_{rfl}$. The measurement can also ensue separately in both sub-systems of the CP coil; the necessary power then results as $P=P_{0fwd}+P_{90fwd}-P_{0rfl}-P_{90rfl}$. When the power loss $P_{coil}$ dissipated in the antenna structure is known, the power $P_{abs}=P-P_{coil}$ remaining in the subject can alternatively be used for evaluation. The excitation is effective when a maximum possible MR-effective field is generated with the lowest necessary power expenditure. An evaluation can ensue, for example, such that the following expression is maximized:

$$1/V \int_{VOI} d^3r\, W_1(\vec{r})B^+(\vec{r})/P = \text{maximal}$$

W(r) here represents a weighting function that enables an amplitude dependent weighting of the acquired RCP field on the spatial position. For example, it is therewith possible to exclude from the evaluation regions in which no subject is present (for example the air-filled paranasal sinus or the space regions surrounding the body) and in which thus no sensible field information can be acquired by means of MR (the MR images merely show noise in these regions) (i.e. W(r)=0 in these regions). V stands for the content of the VOI. The amplitude of the RCP field is determined not as a function of the continuous variables r but rather on a discrete grid with the grid coordinates x, y and z. In practice, integral is not calculated for this purpose, but rather a sum of the formula:

$$1/N \sum_{x,y,z} W_1(x,y,z)B^+(x,y,z)/P = \text{maximal}$$

The discrete variables x, y and z thereby run across the voxel defined by the VOI; N is the total number of the voxels contained in the VOI. In practice the sum is preferably calculated by a computer program.

An alternative evaluation is targeted towards an optimally homogeneous excitation field in the VOI. This evaluation criterion can be described by the following mathematical expression:

$$1/V \int_{VOL} d^3r\, W_2(\vec{r})(B^+(\vec{r})-\bar{B})^2 = \text{minimal}$$

$$\bar{B} = 1/V \int_{VOL} d^3r\, W_2(\vec{r})B^+(\vec{r})$$

The minimization of the standard deviation of the RCP field in the VOI is described with these expressions. In practice the sums are again to be used:

$$1/N \sum_{x,y,z} W_2(x,y,z)(B^+(x,y,z)-\bar{B})^2 = \text{minimal with}$$

$$\bar{B} = 1/N \sum_{x,y,z} W_2(x,y,z)B^+(x,y,z)$$

A computer program for calculation of the sums is again preferably used in practice. A combination of both evaluation criteria can naturally also be used.

In addition to the iterative method previously described for determination of the optimal mixed state of RCP and LCP excitation configuration, a second, more direct method can be used. This method is described in example 5 in connection with a variable optimization. When this method is implemented on the subject with model character previously described, the variable adjustment parameters therewith determined can be used as values for the fixed adjustment parameters in the sense of the example 4.

The procedure described in this example 5 can be applied not only in simple CP transmission coils according to FIG. 3 but rather also in combined transmission/reception coils according to FIG. 1. It should be noted that the phase shifter 7 and the attenuators 8, 9 are connected between transmission hybrid 2 and transmission-reception duplexers 3, 4 so that only the transmission path of the coil 6 but not the reception path is modified. The optimization of the reception path is executed separately.

In transmission coils that comprise more than one CP element, the individual elements are optimized in succession in the described manner.

Example 5

When subjects with different electrical behavior are examined with a CP transmission coil, an optimized local RCP field cannot be achieved in all cases with a fixed setting of the mixed state between RCP and LCP excitation configurations. For example, that is the case given the body coil in which both infants and adults are examined. The optimization of the mixed state must hereby be individually determined for each load situation of the coil. In principle in this case it would also be possible iteratively, i.e. with the method described in example 4. However, the method is time-consuming and requires considerably interaction with the user. A preferred method should effect the optimization in an automated manner.

For this purpose it is necessary to replace the fixed adjustment elements shown in FIG. 3 with variable adjustment elements that can be set by the MR system. This means that both the attenuation values a and b and the phase shift β can be set to defined values within wider limits via control instructions of the MR system. The determination of the optimized mixed state is described in the following.

The local RCP field generated in the RCP configuration (a=1, b=1, β=0) of the transmission antenna is measured with spatial resolution by means of an MR method. In addition to the amplitude $B^+_{rcp}(r)$ the phase $\alpha^+_{rcp}(r)$ can also be determined from the measurement data. At the same time the power $P_{rcp}$ necessary for the generation of this field is measured as described in example 4. The local RCP field generated in the LCP configuration (a=1, b=1, β=180°) is subsequently measured with spatial resolution in amplitude $B^+_{lcp}(r)$ and phase $\alpha^+_{lcp}(r)$ as well as the required power $P_{lcp}$. The measurement variables $B^+_{rcp}(r)$, $B^+_{lcp}(r)$, $\alpha^+_{rcp}(r)$, $\alpha^+_{lcp}(r)$, $P_{rcp}$ and $P_{lcp}$ represent the basis of the optimization.

Given the adjustment of a mixed state of RCP and LCP transmission configurations with the amplitudes $C_{rcp}$ and $C_{lcp}$ as well as the phases $\gamma_{rcp}$ and $\gamma_{lcp}$ the following excitation field is generated:

$$B^+(\vec{r}) = c_{RCP}\exp(i\gamma_{Rcp})B^+_{RCP}(\vec{r})\exp(i\alpha^+_{RCP}(\vec{r})) + c_{LCP}\exp(i\gamma_{LCP})B^+_{LCP}(\vec{r})\exp(i\alpha^+_{LCP}(\vec{r}))$$

for which the power $P = C_{rcp}P_{rcp} + C_{lcp}P_{lcp}$ is required. Analogous to the exemplary embodiment 1, for example, it can be the goal to generate a maximum possible MR-effective field with the lowest necessary power expenditure. In order to achieve this, the following expression must be maximized again:

$$1/N \sum_{x,y,z} W_1(x,y,z)B^+(x,y,z)/P = \text{maximal}$$

Method for calculation of the parameters that satisfy this condition are known in the literature (for example simplex methods, see Seigmund Brandt, "Datenanalyse", BI Wissenschaftsverlag, 1992). As a result of such a calculation (preferably implemented by means of a computer program) one obtains a set of optimal parameters $C_{rcp}^{Opt}$, $C_{lcp}^{Opt}$, $\gamma_{rcp}^{Opt}$ and $\gamma_{lcp}^{Opt}$. As described in example 4, the setting parameters necessary for realization of the mixed state can be calculated therefrom.

In summary, the following steps are necessary in order to achieve the optimal mix of RCP and LCP transmission configurations for each subject:

1. Provision of the suitable hardware
2. Measurement of the local RCP field and the necessary power in RCP transmission configuration
3. Measurement of the local LCP field and the necessary power in LCP transmission configuration
4. Determination of the optimal mixed state
5. Calculation of the adjustment parameters
6. Setting of the adjustment parameters in the adjustment elements and use of these settings in the following measurements All of these steps can be automated in the framework of an adjustment process. Given a change of the electrical properties of the subject that are seen by the coil (for example displacement of the subject relative to the coil), a repetition of this process is necessary.

Alternative optimization criteria can be applied in the same manner. For example, if an optimally homogeneous excitation field stands in the focus, the expression $$1/N \sum_{x,y,z} W_2(x,y,z)(B^+(x,y,z) - \overline{B})^2 = \text{minimal}$$

can be minimized, whereby $$\overline{B} = 1/N \sum_{x,y,z} W_2(x,y,z)B^+(x,y,z)$$

applies again. The process for determination of the optimized mixed state and the calculation of the adjustment parameters as well as their usage is analogous to the process described previously. Here the usage of combinations of the optimization criteria is also possible.

Example 6

An optimization of the transmission field was described in examples 4 and 5. Example 6 concerns the optimization of the sensitivity of a reception coil or, respectively, of a combined transmission/reception coil in the reception operation to the MR signals generated by the precessing magnetization. For this it is generally necessary to operate the CP reception coil neither in a pure RCP configuration nor in a pure LCP configuration in order to be maximally sensitive for the local MR signals generated in the VOI. The practical realization of an optimized mixed state of the reception configuration is described in the following.

FIG. 4 shows a representation of the activation unit of a CP coil reduced to the components necessary for the reception mode. Analogous to the optimized transmission coil, a fixed adjustable phase shifter 7 and two fixed adjustable attenuation elements 8, 9 are present in addition to the standard components. With these three adjustment elements the sensitivity at the output of the reception hybrid 5 can be maximized to an arbitrary mixed state of RCP and LCP signals. The voltage U present at the output X4 is $$U = aU_0\cos(\omega t + \phi_0) + bU_{90}\sin(\omega t + \phi_{90} + \beta)$$

$U_0\cos(\omega t + \phi_0)$ is thereby the signal voltage induced in the 0° reception system, $U_{90}\cos(\omega t + \phi_{90})$ the signal voltage induced in the 90° system. Each volume element of the examination subject can generally lead to different values of $U_0$, $U_{90}$, $\phi_0$ and $\phi_{90}$; the total voltage U then results as an integral over the contributions of all elements.

In a pure RCP reception configuration, $a = b = 1$ and $\beta = 0$ applies. In this case the antenna is maximally sensitive to undistorted pure RCP MR signals for which $U_0 = U_{90}$ and $\phi_0 = \phi_{90}$ applies: $U = 2U_0\cos(\omega t + \phi_0)$. At the same time the antenna is insensitive to pure LCP MR signals for which $U_0 = U_{90}$ and $\phi_0 = \phi_{90} + \pi$ applies: $U = 0$. In reversed form, this applies for a pure LCP reception configuration with $a = b = 1$ and $\beta = 180°$.

The maximum sensitivity to an arbitrary mixed state of the polarization can be achieved via variation of the adjustment parameters a, b and β. As in the transmission case it applies that an optimal mixed state can be determined for subjects that behave in a similar manner with regard to the RF penetration behavior, and with this optimal adjustment variables can be determined. The determination can ensue, for example, iteratively, meaning that, for a subject with model character that is placed in the coil, different adjustment parameters are set in succession and the performance [quality] of the reception properties are evaluated. As soon as a parameter set with highest performance is found, it is technically realized in the form of a hard-set phase shifter and two hard-set attenuators. Ideally measurement is always made with the same transmission configuration during the iteration process.

The performance of the reception properties can be determined on the basis of the spatially-resolved measurement of the SNR. Suitable measurement methods are known in the literature. For example, in the examination volume a series of spin echo images can be acquired as well as pure noise images (acquisition by means of the identical spin echo sequence, in which the RF pulse amplitudes are set to zero), and in a post-processing step the signal of each voxel is divided by the determined average noise level (for example standard deviation of the noise images).

For example, the average SNR can be used as a measure for the performance:

$$1/V \int_{VOI} d^3 r W_3(\vec{r}) SNR(\vec{r}) = \text{maximal}$$

Image regions without information content can again be masked by the weighting function. In practice the calculation of the corresponding sums over the voxels requires:

$$1/N \sum_{x,y,z} W_3(x, y, z) SNR(x, y, z) = \text{maximal}$$

The discrete variables x, y and z thereby run across the voxels defined by the VOI. In practice the sum is preferably calculated by a computer program.

Alternatively, a homogeneous SNR can be used as a performance measure:

$$1/V \int_{VOL} d^3 r W_4(\vec{r})(SNR(\vec{r}) - \overline{SNR})^2 = \text{minimal with}$$

$$\overline{SNR} = 1/V \int_{VOL} d^3 r \, W_4(\vec{r}) SNR(\vec{r})$$

The minimization of the standard deviation of the SNR in the VOI is described with these expressions. In practice the sum is again used:

$$1/N \sum_{x,y,z} W_4(x, y, z)(SNR(x, y, z) - \overline{SNR})^2 = \text{minimum with}$$

$$\overline{SNR} = 1/N \sum_{x,y,z} W_4(x, y, z) SNR(x, y, z)$$

A computer program for calculation of the sums is preferably used again in practice. A combination of both evaluation criteria can naturally also be used.

In reception coils that have more than one CP element, the individual elements are optimized in succession in the described manner.

Example 7

Analogous to example 5, given an optimized CP reception coil variable adjustment elements can be worked with in order to also respectively obtain the optimal reception sensitivity for electrically-different subjects. However, a simpler and simultaneously more universal solution offers itself that is described in the following.

The reception hybrid 5 provides two signals at its two outputs X4 and X5 (see FIG. 5):

$$U_1 = U_0 \cos(\omega t + \phi_0) + U_{90} \sin(\omega t + \phi_{90})$$

$$U_2 = U_0 \cos(\omega t + \phi_0) - U_{90} \sin(\omega t + \phi_{90})$$

In the case of a pure RCP signal, only $U_1$ differs from zero; $U_2$ contains no signal information. Given CP coils in the prior art the signal $U_2$ is not used for this reason (see FIG. 1). However, LCP signal components are present due to the distortion of the MR signal by an electrically-active subject; this leads to signal information $U_2$ differing from zero. For complete acquisition of all signal components it is therefore merely necessary to detect both signal contributions provided by the reception hybrid 5 and to suitably combine them into an image.

For example, the two signals are directed on separate reception channels X4, X5 to separate Rx cassettes, such that the signals can be simultaneously acquired with two A/D converters. Instead of one time data set in the prior art two time data sets are thus now generated by means of any MR method during the image acquisition with the CP coil 6. These two time data sets, for example, can be individually transferred into classical three-dimensional space and then be assembled into a resulting image, for example via quadratic summation. Using the quadratic summation the image information of both individual images $S_1(r)$ and $S_2(r)$ are combined into a total image S(r) according to the following calculation rule:

$$S(r) = \sqrt{S_1^2(r) + S_2^2(r)}$$

In contrast to the prior art, this image comprises not only the signal components that are detected by a CP reception coil in RCP configuration but rather additionally the signal portions detected in LCP configuration. Due to the aforementioned complementarily of the signal contributions, the combined image exhibits a distinctly more homogeneous exposure.

In summary, insofar as the reception hybrid 5 comprises two reception channels X4, X5 this inventive method includes the following steps:
1. Simultaneous but separate acquisition of the time signals present at both outputs of the reception hybrid 5 during the MR experiment,
2. Separate Fourier transformation of both time data sets, generation of two separate images,
3. Combination of the images.

The significant step is here that two reception signals of a CP reception coil are used.

Example 8

This example concerns an inventive normalization method in which the methods described in the examples 4 through 7 are used to achieve a more homogeneous image brightness. In the ideal case, the normalization method is implemented such that, in the reception case, a homogeneous excitation field is obtained as described in example 5 and a homogeneous exposure field is obtained as described in example 7. As a simpler variant, the method can be limited to the usage of the homogeneous exposure according to example 7.

Given acquisitions with local reception coils (surface coils, not limited to CP coils), one generally finds an image brightness clearly dependent on the position of the voxel relative to the coil. The reason for this is the inhomogeneous sensitivity profile S(r) implicit in surface coils: a high sensitivity/brightness exists in the immediate proximity of the coil, a lower sensitivity/brightness is found given greater distance. For this reason normalization methods that should lead to a uniform image exposure are frequently used in the prior art.

In one type of normalization method the information of the images acquired with the surface coils is utilized in order to determine the sensitivity profile by suitable filter algorithms and to obtain a uniform image exposure by multiplication of the image information with 1/S(R).

One generally achieves better results with a second type of normalization method in which the sensitivity profile S(r) is initially determined in an adjustment step. For this purpose the same image is acquired once with the surface coil(s) and once with a volume coil (i.e. a coil in which the S(r) is nearly constant) as a reference image. A series of 2D images or a 3D image is preferably acquired in order to cover the entire examination volume. The transmission coil is identical in both cases. The whole-body coil is frequently used as a volume coil since this is permanently installed in the MR system and exposes the entire imaging volume. Whole-body coils are for the most part executed as CP coils in present-day MR systems. S(r)=MO(r)/MR(r) of the surface coil can be directly determined from the quotient of the two acquired images MO(r) and MR(r). After the adjustment step, images acquired with the surface coil are normalized via per-voxel multiplication with 1/S(r), i.e. homogenized with regard to the image brightness.

It is a requirement for the implementation of this normalization method that a homogeneous exposure is obtained with the volume coil in the entire examination volume. This requirement is generally not satisfied in the high field range: due to the distortion of the polarization state given the presence of electrically-active materials that can turn out to be different for various positions in the subject, an image with sub-optimal homogeneity of the exposure is acquired with a CP volume coil in the prior art. A false result for S(r) is therewith determined and the image quality of the normalized image is possibly even worsened in comparison to an image that is not normalized.

This problem can be successfully counteracted with a CP volume coil that possesses the inventive features according to example 7. For this, the reference image is acquired simultaneous with RCP sensitivity and LCP sensitivity of the CP coil and these images are combined as described. All MR signals are detected in this manner and regions of the subject are also exposed that, due to the distortion of the polarization state of the MR signals generated there, are not mapped or are mapped with reduced brightness with a conventional CP coil. Due to the combined reference image the sensitivity profile of the surface coil can be determined with high precision and a good image quality of normalized images can be achieved.

Given the acquisition of the reference image the case can arise that, given use of a CP coil in the prior art for excitation, no or only a small local RCP field is generated in parts of the examination volume due to the distortion of the polarization state. As a result the local SNR possibly no longer suffices for a reliable determination of the quotient MO(r)/MR(r).

A more homogeneous excitation field can be generated in the entire examination volume with a CP transmission coil according to example 4 or 5; the images MO(r) and MR(r) acquired in this manner are thus clearly better suited as a basis of the calculation of the sensitivity profile.

In summary, this normalization method comprises the following steps:
1. acquisition of an image with a surface coil for acquisition of the signals and with an (optimized) CP transmission coil for excitation,
2. acquisition of the same image as a reference with the identical (optimized) excitation of the CP coil and utilization of both reception signals,
3. calculation of the sensitivity profiles of the surface coil from the two acquired images,
4. normalization of further images acquired with the surface coil by means of the calculated sensitivity profile.

Although modifications and changes may be suggested by those skilled in the art, it is the intention of the inventors to embody within the patent warranted hereon all changes and modifications as reasonably and properly come within the scope of their contribution to the art.

We claim as our invention:
1. A method for generating a magnetic resonance image, comprising the steps of:
placing an examination subject in a homogenous static magnetic field;
operating an RF resonator in a transmission mode to irradiate the examination subject with RF pulses to excite nuclear spins in the examination subject, and operating said RF resonator in a reception mode to detect magnetic resonance signals arising from the excited nuclear spins, and in at least one of said transmission mode and said reception mode, operating said RF resonator as a circularly polarized RF resonator;
when operating said RF resonator as a circularly polarized RF resonator in said transmission mode, supplying said RF resonator from two separate transmission systems to irradiate the measurement subject with said RF pulses, by generating, in each of said separate transmission systems, a temporally-oscillating linear polarized electromagnetic field, and adjusting a phase relationship of the respective linearly polarized magnetic fields to cause a sum field produced in the volume of interest by a superimposition of the respective linear polarized electromagnetic fields to exhibit a right circularly polarized electromagnetic field component having a maximum amplitude locally at a site of the nuclear spins to be excited;
when operating said RF resonator as a circularly polarized RF resonator in said reception mode, connecting said RF resonator to two separate reception systems, by adjusting respective reception sensitivities of the separate reception systems to detect a maximum of right circularly polarized signal components in said magnetic resonant signals with a first of said separate reception systems and a maximum of left circularly polarized signal components in said magnetic resonance signals with a second of said separate reception systems; and
processing the magnetic resonance signals detected by said first and second of said separate reception systems in said reception mode to produce a magnetic resonance image therefrom.

2. A method as claimed in claim 1 comprising, in said transmission mode, optimizing a polarization state of the radiated RF pulses to produce a right circularly polarized component that is high and substantially constant in substantially an entirety of a volume of interest within said measurement subject.

3. A method as claimed in claim 1 comprising, in said transmission mode, optimizing a polarization state of the radiated RF pulses to produce a right circularly polarized field with a maximum amplitude within a specified region of a volume of interest in the measurement subject.

4. A method as claimed in claim 3 wherein the step of optimizing the polarization state of the radiated RF pulses comprises:
designating N regions within said volume of interest, wherein N is a whole number;
successively for each of said N regions, optimizing the polarization state of the radiated RF pulses in the respective N regions and successively detecting magnetic resonance signals, in said reception mode, from each of said N regions, thereby obtaining N sets of magnetic resonance data; and wherein the step of processing the magnetic resonance signals detected in said reception mode comprises generating N magnetic resonance images respectively from said N sets of magnetic resonance data, and combining said N magnetic resonance images into a single magnetic resonance image.

5. A method as claimed in claim 1 comprising, in said transmission mode, setting a polarization state of the radiated RF pulses to an optimized value by adjusting a phase shifter to adjust a phase shift between the respective electromagnetic fields of the respective separate transmission systems, and adjusting respective attenuators in the separate transmission systems to set respective amplitudes of the electromagnetic fields of the separate transmission systems.

6. A method as claimed in claim 5 comprising iteratively adjusting said attenuators and said phase shifter by successively acquiring a plurality of magnetic resonance images until acquiring a homogenously exposed magnetic resonance image.

7. A method as claimed in claim 5 comprising setting said phase shifter and said attenuators according to a mathematical optimization technique to optimize said amplitudes and said phase shift.

8. A method as claimed in claim 1 comprising adjusting a polarization state of the radiated RF pulses in the transmission mode, dependent on the examination subject, by software control of respective amplitude setting elements in the separate transmission systems and a phase shifter that sets a phase shift between the respective electromagnetic fields of the separate transmission systems.

9. A method as claimed in claim 8 comprising iteratively adjusting said attenuators and said phase shifter by successively acquiring a plurality of magnetic resonance images until acquiring a homogenously exposed magnetic resonance image.

10. A method as claimed in claim 8 comprising setting said phase shifter and said attenuators according to a mathematical optimization technique to optimize said amplitudes and said phase shift.

11. A method as claimed in claim 1 comprising, in said reception mode, setting a polarization sensitivity of the resonator used in said reception mode to a fixed optimized value.

12. A method as claimed in claim 11 comprising setting said sensitivity to said fixed optimized value by adjusting respective attenuators in the two separate reception systems that determine respective amplitudes of the magnetic resonance signals in the two separate reception systems and by adjusting a phase shifter that sets a phase shift between the magnetic resonance signals in the two separate reception systems.

13. A method as claimed in claim 1 comprising employing two parallel reception channels as said two separate reception systems, and comprising:

in a first of said parallel reception channels, acquiring an entirety of a right circularly polarized signal component of said magnetic resonance signals and storing the detected signals in a first raw data matrix;

in a second of said parallel reception channels, acquiring an entirety of a left circularly polarized signal component of said magnetic resonance signals and storing the detected signals in a second raw data matrix; and processing the signals in said first raw data matrix to produce a right circularly polarized magnetic resonance image, and processing the signals in the second raw data matrix to produce a left circularly polarized magnetic resonance image.

14. A method as claimed in claim 13 comprising combining said right circularly polarized magnetic resonance image and said left circularly polarized magnetic resonance image, using a mathematical algorithm, to form a single magnetic resonance image.

15. A method as claimed in claim 14 comprising employing a quadratic summation as said mathematical algorithm.

16. A method as claimed in claim 1 comprising subjecting said measurement subject to a magnetic field of at least three Tesla as said homogenous static magnetic field.

17. A method as claimed in claim 1 comprising:

using the same resonator in said transmission mode and in said reception mode to acquire a homogenously-exposed magnetic resonance image of a volume of interest in the measurement subject, for use as a reference image, comprised of voxels exhibiting respective brightness values $MR(r)$;

acquiring a further magnetic resonance image of said volume of interest using said same resonator in said transmission mode and using a local coil as the resonator in the reception mode, said further magnetic resonance image comprising voxels respectively exhibiting brightness values $MO(r)$;

determining a sensitivity profile $S(r)$ of said local coil by calculating, for respective corresponding voxels in said reference image and in said further magnetic resonance image, a quotient of $MR(r)$ and $MO(r)$;

acquiring additional magnetic resonance images of said volume of interest using said local coil in said reception mode, each of said additional magnetic resonance images being comprised of voxels; and normalizing the additional magnetic resonance images by multiplying each voxel thereof with $1/S(r)$.

18. A method as claimed in claim 17 wherein the step of acquiring additional magnetic resonance images of said region of interest comprises acquiring a series of multi-dimensional images that collectively encompass an entirety of said volume of interest.

19. A magnetic resonance apparatus comprising:

a magnetic resonance scanner configured to interact with an examination subject in a homogenous static magnetic field generated by the magnetic resonance scanner;

an RF resonator in said magnetic resonance scanner configured to radiate and receive RF signals into and from the examination subject in the magnetic resonance scanner;

a controller connected to said RF resonator, said controller being configured to operate said RF resonator in a transmission mode to irradiate the examination subject with RF pulses to excite nuclear spins in the examination subject, and to operate said RF resonator in a reception mode to detect magnetic resonance signals arising from the excited nuclear spins, and said controller being configured to operate said RF resonator as a circularly polarized RF resonator in at least one of said transmission mode and said reception mode;

said controller being configured, when operating said RF resonator as a circularly polarized RF resonator in said transmission mode, to supply said RF resonator from two separate transmission system to irradiate the subject with said RF pulses by generating, in each of said separate transmission systems, a temporally-oscillating linear polarized electromagnetic field, and to adjust a phase relationship between the respective linearly polarized magnetic fields to cause a sum field produced in a volume of interest in the subject by a superimposition of the respective linear polarized electromagnetic fields to exhibit a right circularly polarized electromagnetic field component having a maximum amplitude locally at a site of the nuclear spins to be excited;

said controller being configured, when operating said RF resonator as a circularly polarized RF resonator in said reception mode, to connect said RF resonator to two separate reception systems, by adjusting respective sensitivities of the separate reception systems to detect a maximum of right circularly polarized signal components in said magnetic resonance signals with a first of said separate reception systems and a maximum of left circularly polarized components in said magnetic resonance signals with a second of said separate reception systems; and a processor configured to process the magnetic resonance signals detected by said first and second of said separate reception systems in said reception mode to generate a processor output comprising signals in a form allowing a magnetic resonance image of the subject to be displayed.

* * * * *